(12) United States Patent
Park et al.

(10) Patent No.: US 8,116,093 B2
(45) Date of Patent: Feb. 14, 2012

(54) PRINTED CIRCUIT BOARD AND SEMICONDUCTOR MODULE HAVING THE SAME

(75) Inventors: Kwang-Soo Park, Suwon-si (KR); Jong-Hoon Kim, Hwaseong-si (KR)

(73) Assignee: Samsung Electronics Co. Ltd., Suwon-Si (KR)

( * ) Notice: Subject to any disclaimer, the term of this patent is extended or adjusted under 35 U.S.C. 154(b) by 908 days.

(21) Appl. No.: 12/132,309

(22) Filed: Jun. 3, 2008

(65) Prior Publication Data

US 2008/0298034 A1 Dec. 4, 2008

(30) Foreign Application Priority Data

Jun. 4, 2007 (KR) .................. 10-2007-0054252

(51) Int. Cl.
*H05K 7/12* (2006.01)
*H05K 1/11* (2006.01)

(52) U.S. Cl. ........ 361/767; 361/760; 361/790; 361/791; 361/794; 361/795; 174/255; 174/258; 174/259

(58) Field of Classification Search .................. None
See application file for complete search history.

(56) References Cited

U.S. PATENT DOCUMENTS

| | | | | |
|---|---|---|---|---|
| 5,847,936 A | * | 12/1998 | Forehand et al. | 361/794 |
| 5,949,654 A | * | 9/1999 | Fukuoka | 361/760 |
| 6,008,534 A | * | 12/1999 | Fulcher | 257/691 |
| 6,075,710 A | * | 6/2000 | Lau | 361/760 |
| 6,362,525 B1 | * | 3/2002 | Rahim | 257/738 |
| 6,538,213 B1 | * | 3/2003 | Carden et al. | 174/262 |
| 6,542,377 B1 | * | 4/2003 | Fisher et al. | 361/777 |
| 6,875,930 B2 | * | 4/2005 | Peterson | 174/261 |
| 7,034,391 B2 | | 4/2006 | Pendse | |
| 7,107,673 B2 | | 9/2006 | Kwong et al. | |
| 7,425,458 B2 | * | 9/2008 | Seshan | 438/17 |
| 7,425,684 B2 | * | 9/2008 | Ta | 174/255 |
| 7,709,747 B2 | * | 5/2010 | Morlion et al. | 174/262 |

FOREIGN PATENT DOCUMENTS

KR    2002-0072043    9/2002

* cited by examiner

*Primary Examiner* — Boris Chervinsky
(74) *Attorney, Agent, or Firm* — F. Chau & Associates, LLC

(57) ABSTRACT

A printed circuit board (PCB) includes a substrate having a first group of at least two via holes and a second group of at least two via holes formed therein, a first pad set of terminal pads and a second pad set of terminal pads formed on the substrate, and a first group of conductive connection members and a second group of conductive connection members formed in the substrate. The first group of the via holes are surrounded by the first pad set of the terminal pads and the second group of the via holes are surrounded by the second pad set of the terminal pads. The first and the second groups of conductive connection members fill up the first and second groups of the via holes. The first group of the conductive connection members are connected to the first pad set of the terminal pads and the second group of the conductive connection members are connected to the second pad set of the terminal pads.

12 Claims, 5 Drawing Sheets

PRINTED CIRCUIT BOARD AND SEMICONDUCTOR MODULE HAVING THE SAME

CROSS-REFERENCE TO RELATED APPLICATIONS

This application claims priority under 35 U.S.C. §119 to Korean Patent Application No. 2007-54252, filed on Jun. 4, 2007, the disclosure of which is hereby incorporated by reference in its entirety.

BACKGROUND OF THE INVENTION

1. Technical Field

Exemplary embodiments of the present invention relate to a printed circuit board (PCB) and a semiconductor module including the same. More particularly, exemplary embodiments of the present invention relate to a PCB on which a semiconductor package is mounted and a semiconductor module including the same.

2. Description of the Related Art

Various types of semiconductor packages are being developed as applications thereof are continuing to expand. The semiconductor packages are becoming smaller and lighter in response to trends in forming miniaturized and high-speed semiconductor chips. In particular, the electrical properties of the semiconductor packages, which were less important in conventional low-speed operation, are becoming increasing important factors limiting the operation speeds of the semiconductor chips operating at high speeds.

Pins, which are elements of a semiconductor package, electrically connect the inside and the outside of the semiconductor chip, and electrical properties of the pins are key factors in high speed operation. Thus, various semiconductor package structures according to the physical structures and arrangement methods of the pins have been proposed. Nowadays, a ball grid array (BGA) packages, chip scale packages (CSPs), flip-chip packages, etc. are universally used.

In particular, a BGA package has excellent features in terms of density and general purpose use. The BGA package may use a laminated printed circuit board (PCB) as a substrate for manufacturing a semiconductor module of a multi-chip module type and may include a plurality of conductive pads for electrical connections with a motherboard, a back plane, an application board, and so on. In the BGA package, a solder ball such as a BGA is used for an electrical connection. Generally, the above-mentioned semiconductor modules using the laminated PCB having organic material are called plastic BGAs.

PCBs now also have fine patterns, and have become smaller and packaged in response to the trend in forming miniaturized semiconductor packages. The demand for integrated and miniaturized circuits of the PCBs as well as changes in raw material is increasing to manufacture a PCB having a high degree of integration and reliability. Accordingly, a multilayer PCB including an inner layer and an outer layer may be used to expand a wiring region of the PCB.

Conventionally, conductive lines, such as traces for a power line or a signal line crossing over a mounting region of the semiconductor package, are disposed in the inner layer of the PCB. However, because nowadays various semiconductor packages are mounted on the PCB and kinds of the power and signal lines are increasing, spaces for routing the traces in the inner layer of the PCB are becoming insufficient. Therefore, spaces for routing the traces on the outer layer where the semiconductor package is mounted are needed.

SUMMARY OF THE INVENTION

Exemplary embodiments of the present invention provide a printed circuit board (PCB) for mounting semiconductor packages densely.

Exemplary embodiments of the present invention provide a semiconductor module including the above-mentioned PCB.

According to an exemplary embodiment of the present invention, a printed circuit board (PCB) is provided. The PCB includes a substrate having a first group of at least two via holes and a second group of at least two via holes formed therein, a first pad set of terminal pads and a second pad set of terminal pads formed on the substrate, and a first group of conductive connection members and a second group of conductive connection members formed in the substrate. The first group of the via holes are surrounded by the first pad set of the terminal pads and the second group of the via holes are surrounded by the second pad set of the terminal pads. The first and the second group conductive connection members fill up the first and second groups of the via holes. In addition, the first group of the conductive connection members are connected to the first pad set of the terminal pads and the second group of the conductive connection members are connected to the second pad set of the terminal pads.

In an exemplary embodiment, the substrate includes a plurality of stacked layers.

In an exemplary embodiment, the first and second pad sets of the terminal pads may be arrayed in a rectangle shape, and each of the first and second pad sets of the terminal pads may include at least six terminal pads. The via holes may be respectively disposed in the middle of two rectangle shapes defined by six terminal pads. The conductive connection members may be respectively connected to two terminal pads that are positioned in the middle of six terminal pads.

In an exemplary embodiment, at least one of the first and the second groups of conductive connection member may include a contact filling up at least one of the via holes and a trace formed on the substrate to electrically connect the contact and at least one of the terminal pad.

In an example embodiment, the PCB may further include a conductive line formed on the substrate to pass through the substrate between the first and second pad sets. The conductive line may be a signal line, a power line, a ground line, etc.

In an exemplary embodiment, at least one of the terminal pads may be a solder mask defined (SMD) type of a bonding pad.

In accordance with another of the present invention, a semiconductor module is provided. The semiconductor module includes a printed circuit board (PCB) and a semiconductor package. The PCB includes a substrate having first group of at least two via holes and a second group of at least two via holes formed therein, a first pad set of terminal pads and a second pad sets of terminal pads formed on the substrate and a first group of conductive connection members and a second group of conductive connection members formed in the substrate. The first group of the via holes are surrounded by the first pad set of the terminal pads and the second group of the via holes are surrounded by the second pad set of the terminal pads. The first and the second groups of conductive connection members fill up the first and second groups of the via holes. The first group of the conductive connection members are connected to the first pad set of the terminal pads and the second group of the conductive connection members are connected to the second pad set of the terminal pads. The semiconductor package is mounted on the PCB. The semiconductor package includes external terminal pads that electrically connected to the first and second pad sets of the terminal pads of the PCB respectively.

In an exemplary embodiment, the first and second pad sets of the terminal pads may be arrayed in a rectangle shape and each of the first and second pad sets of the terminal pads may include at least six terminal pads. The via holes may be respectively disposed in the middle of two rectangle shapes defined by six terminal pads and the conductive connection members may be respectively connected to two terminal pads that are positioned in the middle of six terminal pads.

In an exemplary embodiment, at least one the first and the second groups of conductive connection members may include a contact filling up the via hole and a trace formed on the substrate to electrically connect the contact and the terminal pad.

In an exemplary embodiment, a plurality of the semiconductor packages may be mounted on the PCB and the conductive line may cross over the semiconductor packages.

According to exemplary embodiments of the present invention, one pad set includes the terminal pads arranged in two adjacent columns on the PCB and a plurality of the via holes are arranged between the terminal pads of each the pad set to provide spaces for routing the conductive line between adjacent pad sets.

Therefore, the conductive line is arranged on the PCB to pass through between the adjacent pad sets so that the semiconductor package may become smaller, thinner and lighter in weight.

BRIEF DESCRIPTION OF THE DRAWINGS

Exemplary embodiments of the present invention can be understood in more detail from the following description when taking in conjunction with the accompanying drawings, in which.

Figure 1:
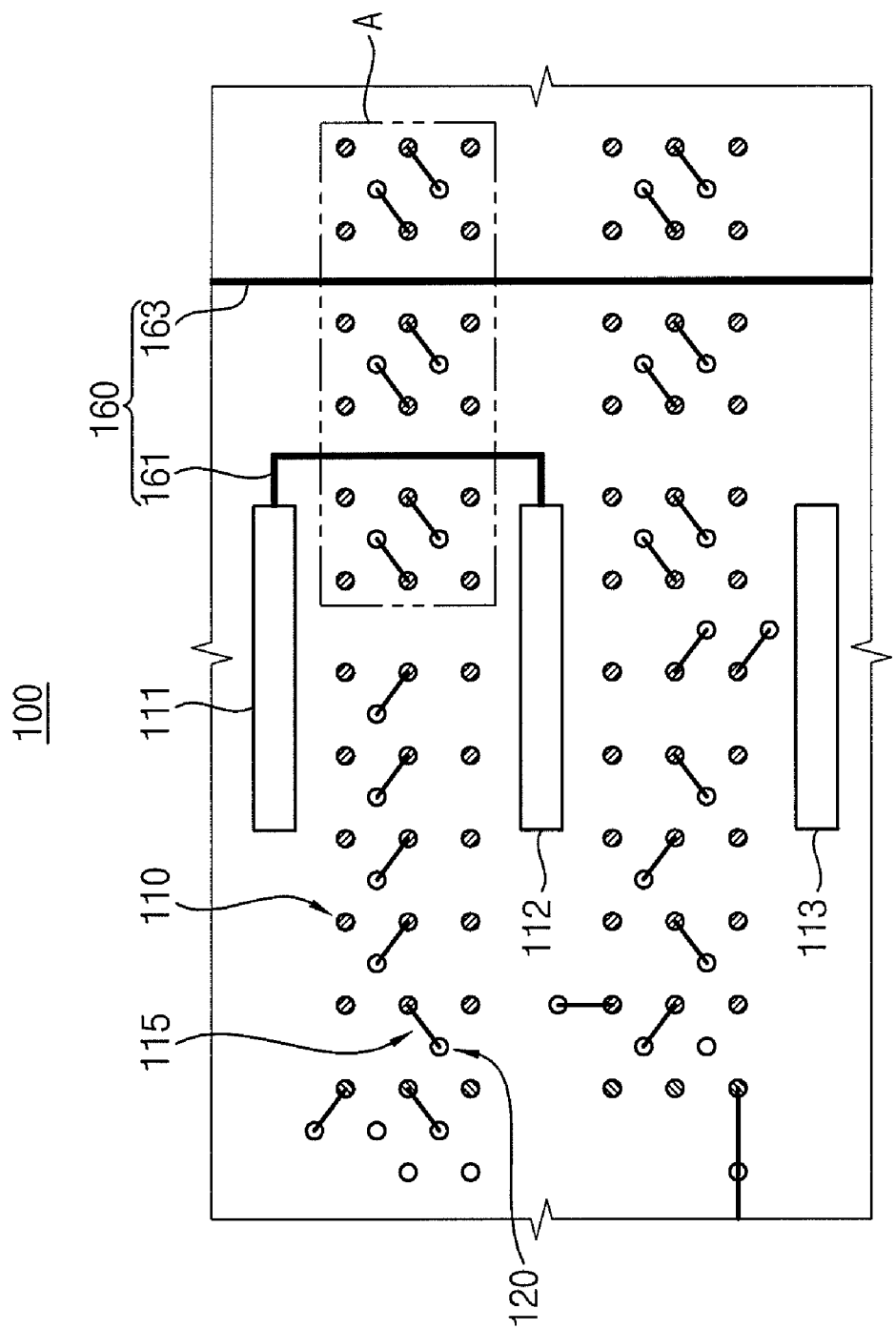
FIG. 1 is a plan view illustrating a printed circuit board (PCB) in accordance with an exemplary embodiment of the present invention.

DESCRIPTION OF THE EXEMPLARY
EMBODIMENTS OF THE INVENTION

The present invention is described more fully hereinafter with reference to the accompanying drawings, in which exemplary embodiments of the present invention are shown. The present invention may, however, be embodied in many different forms and should not be construed as limited to the exemplary embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Printed Circuit Board (PCB)

Figure 2:
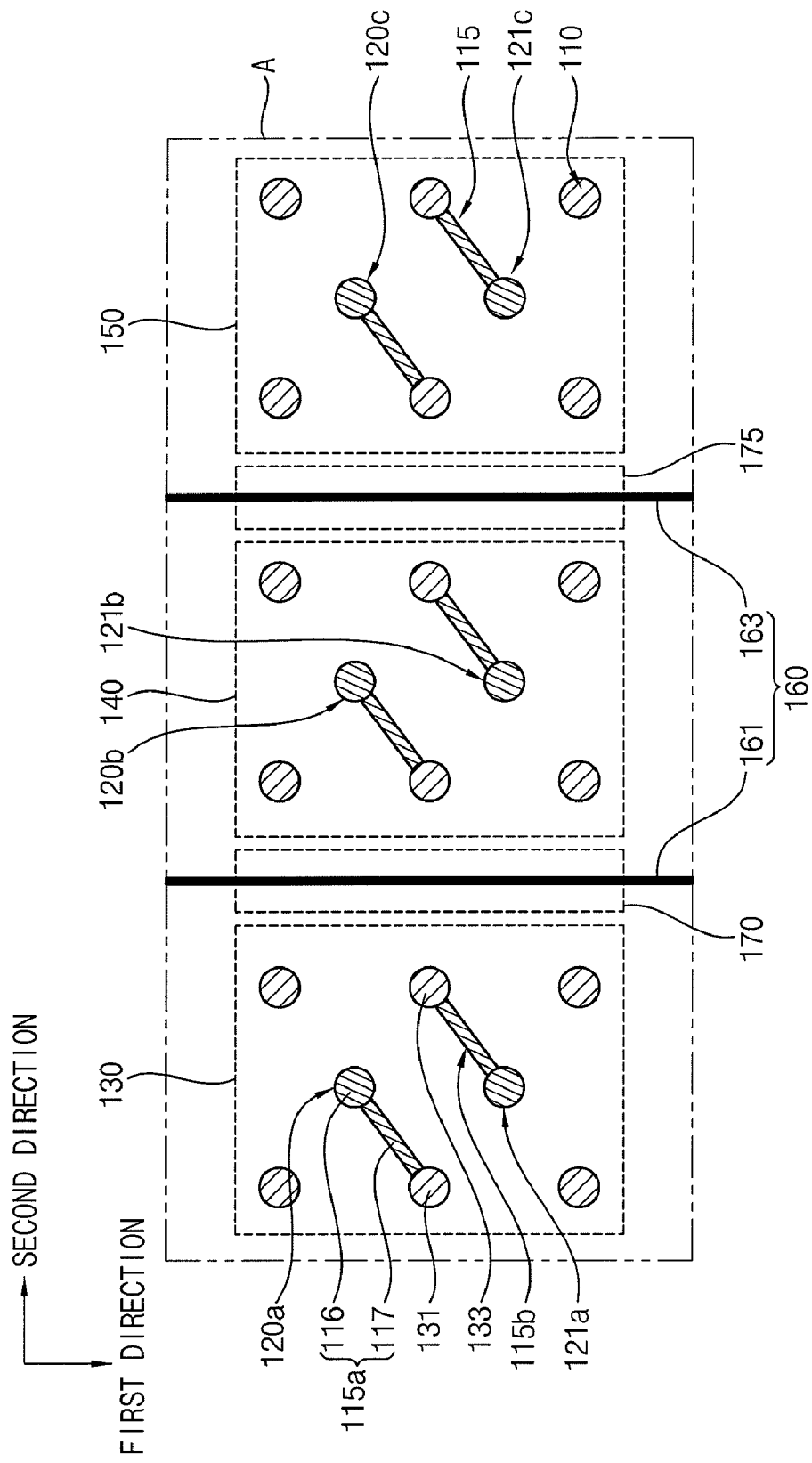
FIG. 2 is an enlarged view illustrating a portion "A" in FIG. 1.

FIG. 1 is a plan view illustrating a printed circuit board (PCB) in accordance with an exemplary embodiment of the present invention. FIG. 2 is an enlarged view illustrating a portion "A" in FIG. 1.

Referring to FIG. 1, terminal pads 110 and via holes 120 are formed in a PCB 100 according to an exemplary embodiment of the present invention. The terminal pads 110 are electrically connected to external terminal pads, respectively. The via holes 120 are spaced apart from the terminal pads 110 by a predetermined distance.

The PCB 100 may be a single-layer PCB or a multilayer PCB. In an exemplary embodiment, the PCB may be a multilayer circuit board including six layers consisting of two outer layers of an uppermost layer and a lowermost layer, and four inner layers. Alternatively, the PCB may include four layers, eight layers, ten layers or more according to the complexity of the PCB.

In an exemplary embodiment, a power circuit, a ground circuit and a signal circuit may be formed in the inner layer. Wirings of each of the layer may be connected to each other by the via holes. The terminal pads 110 and the via holes 120 may be formed in the uppermost layer or the lowermost layer.

A semiconductor package including a semiconductor chip may be mounted on the uppermost layer of the PCB 100. The external terminal pads may be formed on a lower surface of the semiconductor package opposed to the uppermost layer of the PCB 100. The external terminal pads may make contact with the terminal pads 110 formed on the uppermost layer of the PCB 100 so that the external terminal pads are electrically connected to the terminal pads 110.

The terminal pads 110 may be connected to the external terminal pads by a solder ball such as, for example, a ball grid array (BGA). For example, the external terminal pads of the semiconductor package and the terminal pads 110 of the PCB 100 may be bonding pads of a solder mask defined (SMD) type or bonding pads of a non-solder mask defined (NSMD) type.

Referring to FIG. 2, the terminal pads 110 may be arranged in a 3×4 or larger array. The terminal pads 110 may be spaced apart from one another by a predetermined distance. The terminal pads 110 may be arranged in at least four columns along a first direction. The terminal pads 110 may be arranged in at least three rows along a second direction perpendicular to the first direction.

One pad set may include the terminal pads arranged in two adjacent columns. For example, a first pad set 130 of the terminal pads are arranged in first and second columns. A second pad set 140 of the terminal pads are arranged in third and fourth columns. A third pad set 150 of the terminal pads are arranged in fifth and sixth columns.

The number of the rows and columns of the first, second and third pad sets may be the same as or different from one another. For example, the number of the row and columns of the first pad set may be greater than the number of the rows and columns of the second and third pad sets.

A plurality of the via holes 120 are arranged between the terminal pads of each the pad set to provide spaces 170 and 175 for routing a conductive line 160 between adjacent pad sets.

For example, a first, second and third groups of the via holes may be formed in the PCB 110. The first, second and third groups of the via holes set may include at least two via holes. The first group of the via holes 120a and 121a are surrounded by the first pad set of the terminal pads, respectively. The second group of the via holes 120b and 121b are surrounded by the second pad set of the terminal pads, respectively. The third group of the via holes 120c and 121c are surrounded by the third pad set of the terminal pads, respectively.

The via holes 120 are selectively connected by a conductive connection member 115 to the terminal pads that are arranged in any one row of each the pad set, respectively. The conductive connection member 115 is formed in the PCB 100 to fill up the first, second and third groups of the via holes so that the conductive connection member 115 connects the via hole and the terminal pad. For example, the conductive connection member 115 may be formed on a surface of the uppermost layer of the PCB 100 or in the uppermost layer of the PCB 100.

In an exemplary embodiment, a first terminal pad 131 of the first pad set 103 may be positioned in an inner row. A second terminal pad 133 may be positioned in the inner row where the first terminal pad 131 is positioned. The second terminal pad 133 may be positioned adjacent to the first terminal pad 131. For example, when the first pad set 130 of the terminal pads are arranged in three rows, the first terminal pad 131 of the first pad set 130 is positioned in a second row, and the second terminal pad 133 adjacent to the first terminal pad 131 is positioned in the second row.

The first via hole 120a may be located in an Nth quadrant (N is a natural number greater than or equal to 1 and less than or equal to 4), when the quadrant origin is located at the first terminal pad 131. The second via hole 120b may be located in an [N+2]th quadrant ([N+2] is a remainder when N+2 is divided by 4), when the quadrant origin is located at the second terminal pad 133.

In an exemplary embodiment, the first terminal pad 131 of the first pad set 130 arranged in the second row is connected by a first conductive connection member 115a to the first via hole 120a that is located in a first quadrant when the quadrant origin is located at the first terminal pad 131. The second terminal pad 133 of the first pad set 130 is adjacent to the first terminal pad 131. The second terminal pad arranged in the same row as the first terminal pad 131 is connected by a second conductive connection member 115b to the second via hole 120b that is located in a third quadrant when the quadrant origin is located at the second terminal pad 133.

The first conductive connection member 115a may be electrically connected to the first terminal pad 131 and the second conductive connection member 115b may be electrically connected to the second terminal pad 133. The first conductive connection member 115a may include a contact 116 and a trace 117. The first via hole 120a is filled with the contact 116. The trace 117 is formed on the uppermost layer of the PCB 100 to electrically connect the contact 116 and the first terminal pad 131.

The conductive line 160 is formed between adjacent pad sets in the uppermost layer of the PCB 100. A first routing region 170 is formed on the PCB 100 between the first pad set 130 and the second pad set 140. A second routing region 175 is formed on the PCB 100 between the second pad set 140 and the third pad set 150.

A first conductive line 161 is formed between the first pad set 130 and the second pad set 140 to pass through the first routing region 170. A second conductive line 163 is formed between the second pad set 140 and the third pad set 150 to pass through the second routing region 175. In an exemplary embodiment, the conductive line 160 may be a signal line, a power line or a ground line.

Referring again to FIG. 1, various power circuit portion or signal patterns as well as terminal patterns are disposed on the PCB 100. For example, first, second and third power circuit portions 111, 112 and 113 may be disposed on the PCB 100. A group of the terminal pads may be arranged between the first power circuit portion 111 and the second power circuit portion 112. Another group of the terminal pads may be arranged between the second power circuit portion 112 and the third power circuit portion 113.

In an exemplary embodiment, the first conductive line 161 that passes through the PCB between adjacent pad sets may connect the first power circuit portions 111 and the second power circuit portion 112. In addition, the second conductive line 163 for a signal, a power or a ground may pass through the PCB between adjacent pad sets.

Accordingly, because the via holes may be arranged in one pad set and the conductive line formed on the uppermost layer of the PCB 100 may pass through the PCB 100 between adjacent pad sets, the semiconductor package may become smaller, thinner and be lighter in weight.

Figure 3:
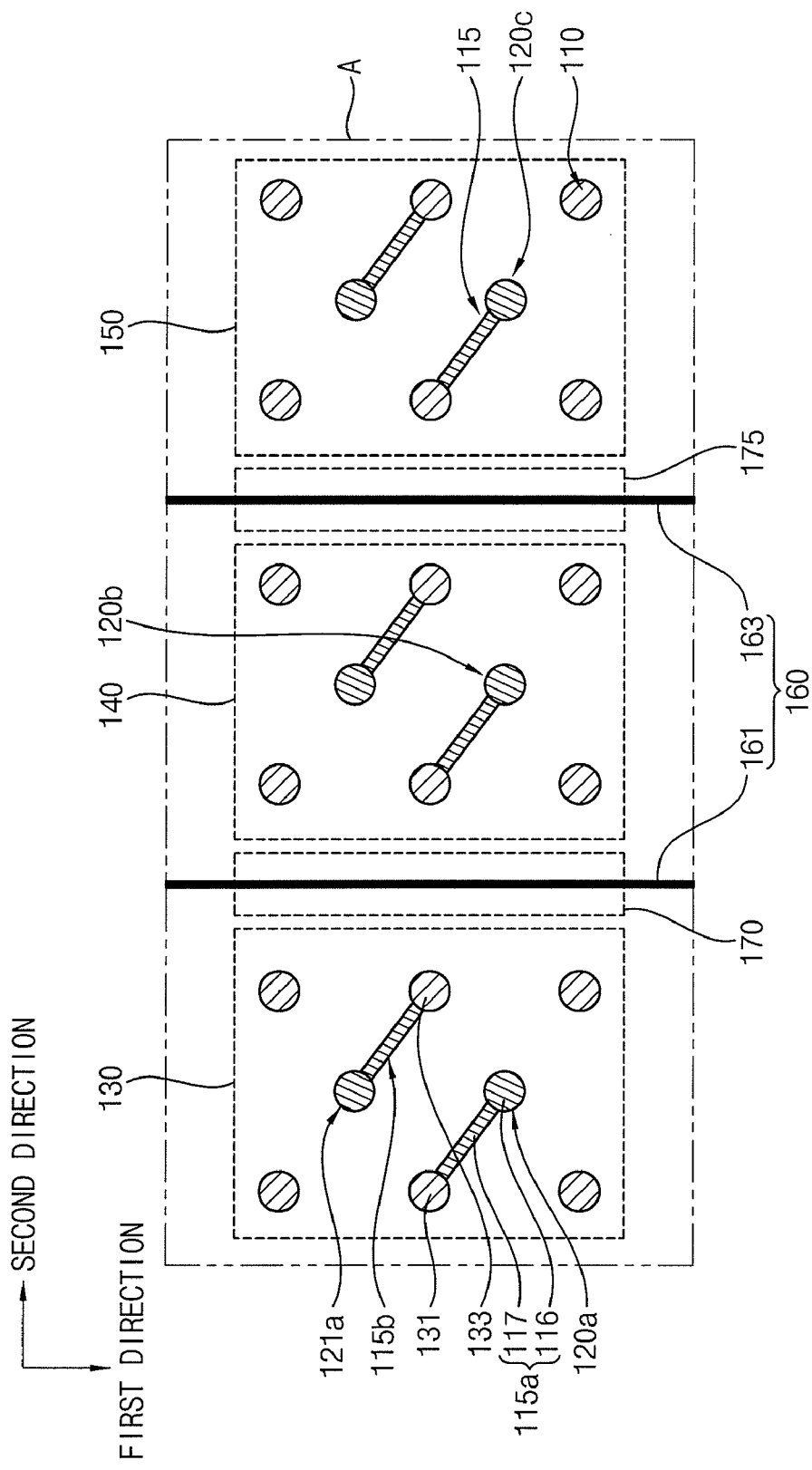
FIG. 3 is an enlarged view illustrating a PCB in accordance with an exemplary embodiment of the present invention.

FIG. 3 is an enlarged view illustrating a PCB in accordance with another exemplary embodiment of the present invention. The PCB of the present embodiment may be same as in the exemplary embodiment of FIG. 1 except for positions of the via holes connected to the terminal pads. Thus, the same reference numerals will be used to refer the same or like elements in FIG. 2, and any further explanation will be omitted.

Referring to FIG. 3, according to another exemplary embodiment of the present invention, terminal pads 110 and via holes 120 are formed in a PCB. The terminal pads 110 are electrically connected to external terminal pads, respectively. The via holes 120 are spaced apart from the terminal pads 110 by a predetermined distance.

The terminal pads 110 may be arranged in a 3×4 or larger array. The terminal pads 110 may be spaced apart from one another by a predetermined distance. The terminal pads 110 may be arranged in at least four columns along a first direction. The terminal pads 110 may be arranged in at least three rows along a second direction perpendicular to the first direction.

One pad set may include the terminal pads arranged in two adjacent columns. For example, a first pad set 130 of the terminal pads are arranged in first and second columns. A second pad set 140 of the terminal pads are arranged in third and fourth columns. A third pad set 150 of the terminal pads are arranged in fifth and sixth columns.

In another exemplary embodiment, a first terminal pad 131 of the first pad set 130 may be positioned in an inner row. A second terminal pad 133 may be positioned in the inner row where the first terminal pad 131 is positioned. The second terminal pad 133 may be positioned adjacent to the first terminal pad 131. For example, when the first pad set 130 of the terminal pads arranged in three rows, the first terminal pad 131 of the first pad set 130 is positioned in a second row, and the second terminal pad 133 adjacent to the first terminal pad 131 is positioned in the second row.

The first terminal pad 131 of the first pad set 130 arranged in the second row is connected by a first conductive connection member 115a to the first via hole 120a that is located in a fourth quadrant when the quadrant origin is located at the first terminal pad 131. The second terminal pad 133 of the first pad set 130 is adjacent to the first terminal pad 131. The second terminal pad 133 arranged in the same row as the first terminal pad 131 is connected by a second conductive connection member 115b to the second via hole 120b that is located in a second quadrant when the quadrant origin is located at the second terminal pad 133.

The first conductive connection member 115a to fill up the first via hole 120a may be electrically connected to the first terminal pad 131 and the second conductive connection member 115b to fill up the second via hole 120b may be electrically connected to the second terminal pad 133. The first conductive connection member 115a may include a contact 116 and a trace 117. The first via hole 120a is filled with the contact 116. The trace 117 is formed on the uppermost layer of the PCB 100 to electrically connect the contact 116 and the first terminal pad 131.

A conductive line 160 is formed between adjacent pad sets in the uppermost layer of the PCB. A first routing region 170 is formed on the PCB between the first pad set 130 and the second pad set 140. A second routing region 175 is formed on the PCB between the second pad set 140 and the third pad set 150.

A first conductive line 161 is formed between the first pad set 130 and the second pad set 140 to pass through the first routing region 170. A second conductive line 163 is formed between the second pad set 140 and the third pad set 150 to pass through the second routing region 175. In another exemplary embodiment, the conductive line 160 may be a signal line, a power line or a ground line.

Semiconductor Module

Figure 4:
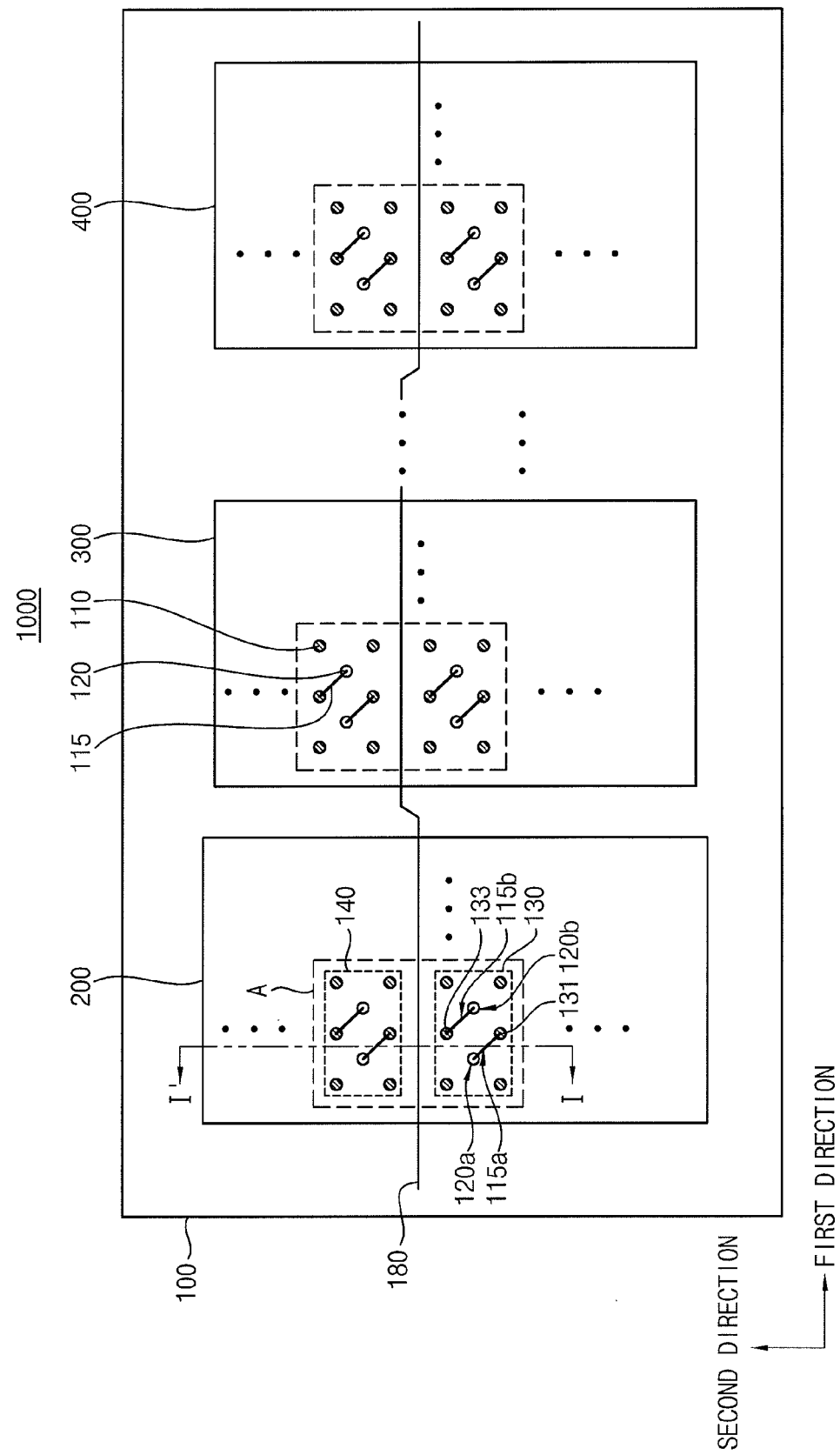
FIG. 4 is a plan view illustrating a semiconductor module including a PCB in accordance with an exemplary embodiment.
Figure 5:
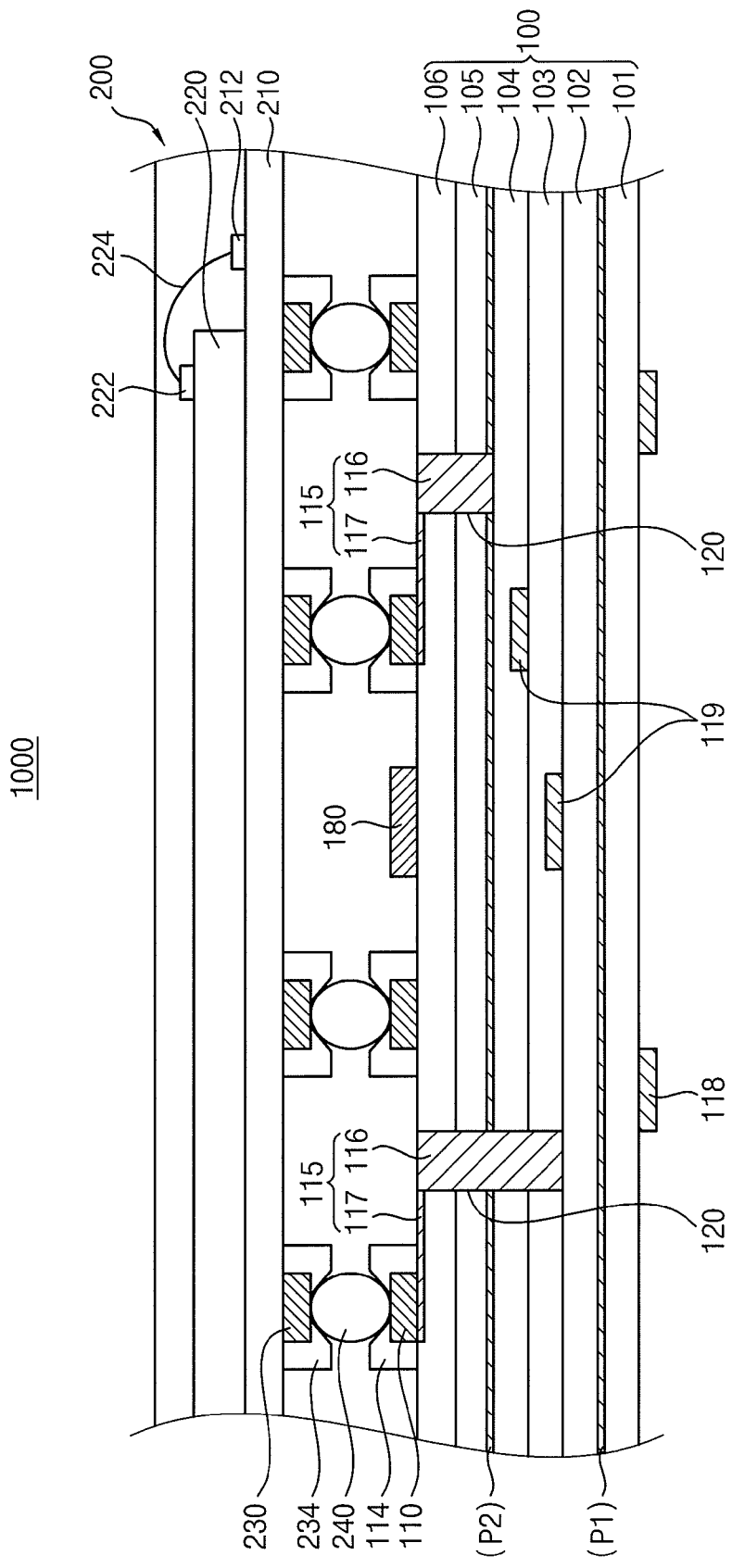
FIG. 5 is a cross-sectional view taken along a line I-I' in FIG. 4.

FIG. 4 is a plan view illustrating a semiconductor module including a PCB in accordance with an exemplary embodiment of the present invention. FIG. 5 is a cross-sectional view taken along a line I-I' in FIG. 4.

Referring to FIGS. 4 and 5, a semiconductor module 1000 includes a PCB 100 having terminal pads 110 and via holes 120 formed thereon, and semiconductor packages 200, 300 and 400 mounted on the PCB 100.

The PCB 100 may be a single-layer PCB or a multilayer PCB. For example, the PCB 100 may include four layers, eight layers, ten layers or more according to the complexity of the PCB. In an exemplary embodiment, the PCB 100 may be a multilayer circuit board including six layers consisting of two outer layers of an uppermost layer and a lowermost layer, and four inner layers.

In an exemplary embodiment, conductive pads 118 are formed on a lower surface of lowermost layer 101. A first inner layer 102 is formed on the lowermost layer 101. The first inner layer 102 may include a power/ground plane (P1) formed on an upper surface of the lowermost layer 101. A second inner layer 103 and a third inner layer 104 including dielectric material are sequentially formed on the first inner layer 102. Conductive patterns 119 may be formed in the second and third inner layers 103 and 104. A fourth inner layer 105 is formed on the third 104. The fourth inner layer 105 may include a power/ground plane (P2). An uppermost layer 106 is formed on the fourth inner layer 105. The terminal pads 110 are formed on the uppermost layer 106. Accordingly, the PCB 100 may include a power circuit, a ground circuit, a signal circuit, and so on therein. Wirings of each the layer may be connected by the via holes 120. The via holes 120 are filled with conductive material to contacts so that a plurality of the layers of the printed circuit 100 may be electrically connected by the contacts.

The semiconductor package 200 is mounted on the uppermost layer of the PCB 100. The semiconductor package 200 may include at least one semiconductor chip 220 mounted on a mounting substrate 210. An input/output pad 222 is formed on an active surface of the semiconductor chip 220, and a bond finger 212 is formed on an upper surface of the mounting substrate 210.

For example, after the semiconductor chip 220 is adhered to the mounting substrate 210 by a die boning process, the semiconductor chip 220 is electrically connected to the mounting substrate by a wire bonding process. By the wire bonding process, both end portions of a bonding wire 224 are adhered to the input/output pad 222 of the semiconductor chip 220 and the bond finger 21 of the mounting substrate 210.

External terminal pads 230 are formed on a lower surface of the mounting substrate 210 of the semiconductor package 100. The lower surface of the mounting substrate 210 is opposed to the uppermost layer of the PCB 100. The external terminal pads 230 are electrically connected to the terminal pads 110 formed on the uppermost layer of the PCB 100.

The terminal pads 110 may be connected to the external terminal pads 230 by a solder ball such as, for example, a BGA. For example, the external terminal pads 230 of the semiconductor package 200 and the terminal pads 110 of the PCB 100 may be bonding pads of a solder mask defined (SMD) type or bonding pads of a non-solder mask defined (NSMD) type.

In an exemplary embodiment, a first solder mask 114 is formed on the terminal pad 110 of the PCB 100. A portion of the terminal pad 110 is covered with the first solder mask 114 and the terminal pad 110 is partially exposed through the first solder mask 114. A second solder mask 234 is formed on the external terminal pad 230 of the semiconductor package 200. A portion of the external terminal pad 230 is covered with the second solder mask 234 and the external terminal pad 230 is partially exposed through the second solder mask 234.

An end portion of a solder ball 240 is adhered to the terminal pad 110 and another end portion of the solder ball 240 is adhered to the external terminal pad 230 of the semiconductor package 200. Accordingly, the semiconductor package 200 is electrically connected to the PCB 100 by the solder ball 240. The first and second solder masks 114 and 234 may prevent a liquefied solder from flowing out in an undesired direction to maintain a shape of the solder ball 240 after reflow.

In an exemplary embodiment, the terminal pads 110 may be arranged in a 3×4 or larger array. The terminal pads 110 may be spaced apart from one another by a predetermined distance. The terminal pads 110 may be arranged in at least four columns along a first direction. The terminal pads 110 may be arranged in at least three rows along a second direction perpendicular to the first direction. One pad set may include the terminal pads arranged in two adjacent columns. Referring to a portion "A" in FIG. 4, a first pad set 130 of the terminal pads are arranged in first and second columns. A second pad set 140 of the terminal pads are arranged in third and fourth columns.

A plurality of the via holes 120 are arranged between the terminal pads of each the pad set to provide a space for routing a conductive line 180 between adjacent pad sets. The via holes 120 are selectively connected by a conductive connection member 115 to the terminal pads that are arranged in any one column of each the pad set, respectively. The conductive connection member 115 is formed in the PCB 100 to fill up the via hole 120 so that the conductive connection member 115 connects the via hole and the terminal pad. For example, the conductive connection member 115 may be formed on the surface of the uppermost layer of the PCB 100 or in the uppermost layer of the PCB 100.

In an exemplary embodiment, the conductive connection member 115 includes a contact 116 and a trace 117. The via hole 120 is filled with the contact 116. The trace 117 is formed on the uppermost layer of the PCB 100 to electrically connect the contact 116 and the terminal pad 110.

First and second groups of the via holes may be formed in the PCB 100. The first and second groups of the via holes may include at least two via holes. The first group of the via holes 120a and 121a are surrounded by the first pad set of the terminal pads, respectively. The second group of the via holes 120b and 121b are surrounded by the second pad set of the terminal pads, respectively. First and second groups of the conductive connection members 115 are formed on the PCB 100 to fill up the first and second groups of the via holes so that the conductive connection members 115 selectively connect the via holes and the terminal pads.

In an exemplary embodiment, a first terminal pad 131 of the first pad set 130 arranged in a second row is connected by a first conductive connection member 115a to the first via hole 120a that is located in a first quadrant when the quadrant origin is located at the first terminal pad 131. A second terminal pad 133 of the first pad set 130 is adjacent to the first terminal pad 131. The second terminal pad 133 arranged in the same row as the first terminal pad 131 is connected by a second conductive connection member 115b to the second via hole 120b that is located in a third quadrant when the quadrant origin is located at the second terminal pad 133.

The conductive line 180 is formed between adjacent pad sets on the PCB 100. The conductive line 180 is formed to pass through a space between the first pad set 130 and the second pad set 140 on a mounting region of the first semiconductor package 200. The conductive line 180 is formed to cross over the semiconductor packages 300 and 400 that are spaced apart from the first semiconductor package 200. For example, the conductive line 180 may be a signal line, a power line or a ground line.

The conductive line 180 may be formed on the outer layer of the PCB 100, not in the inner layer. Accordingly, the conductive line 180 such as the signal line needed to cross over the semiconductor packages may be readily arranged on the outer layer of the PCB 100.

As mentioned above, according to exemplary embodiments of the present invention, the PCB includes first and second groups of at least two via holes formed on the substrate. First and second pad sets of the terminal pads are formed on the substrate to surround the first and second groups of the via holes respectively. A conductive line is arranged on the substrate to pass through the substrate between the first and second pad sets.

Therefore, the conductive line is arranged on the uppermost layer of the PCB 100 to pass through between the adjacent pad sets so that the semiconductor package may become smaller, thinner and lighter in weight.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:
1. A printed circuit board (PCB) comprising:
   a substrate having a first group of at least two via holes and a second group of at least two via holes formed therein, wherein the substrate comprises a plurality of stacked layers;
   a first pad set of terminal pads and a second pad set of terminal pads each formed on an uppermost layer of the stacked layers of the PCB substrate, the first group of the via holes being surrounded by the first pad set of termi- nal pads and the second group of the via holes being surrounded by the second pad set of terminal pads;

a first group of conductive connection members and a second group of conductive connection members formed in the substrate, the first and the second groups of conductive connection members filling up the first and the second groups of the via holes, the first group of the conductive connection members being connected to the first pad set of terminal pads and the second group of the conductive connection members being connected to the second pad set of terminal pads; and a conductive line formed on the uppermost layer of the PCB substrate between the first pad set of terminal pads and the second set of terminal pads to pass through a region of the PCB substrate located between the first pad set of terminal pads and the second pad set of terminal pads, wherein the conductive line is at least any one of a signal line, a power line and a ground line.

2. The PCB of claim 1, wherein the first and second pad sets of terminal pads are arrayed in a rectangle shape.

3. The PCB of claim 2, wherein each of the first and second pad sets of terminal pads comprises at least six terminal pads.

4. The PCB of claim 3, wherein the via holes are respectively disposed in the middle of two rectangle shapes defined by six terminal pads.

5. The PCB of claim 4, wherein the conductive connection members are respectively connected to two terminal pads that are positioned in the middle of six terminal pads.

6. The PCB of claim 1, wherein at least one of the first and the second groups of conductive connection members comprises a contact filling up at least one of the via holes; and a trace formed on the substrate to electrically connect the contact and at least one of the terminal pads.

7. The PCB of claim 1, wherein at least one the terminal pads is a solder mask defined (SMD) type of a bonding pad.

8. A semiconductor module comprising:

a printed circuit board (PCB) including a substrate having a first group of at least two via holes and a second group of at least two via holes formed therein, wherein the substrate comprises a plurality of stacked layers;

a first pad set of terminal pads and a second pad set of terminal pads each formed on an uppermost layer of the stacked layers of the PCB substrate, the first group of the via holes being surrounded by the first pad set of terminal pads and the second group of the via holes being surrounded by the second pad set of terminal pads;

a first group of conductive connection members and a second group of conductive connection members formed in the substrate, the first and the second groups of conductive connection members filling up the first and the second group of the via holes, the first group of the conductive connection members being connected to the first pad set of terminal pads and the second group of the conductive connection members being connected to the second pad set of terminal pads;

a plurality of semiconductor packages spaced apart from each other and mounted on the PCB, the semiconductor packages including external terminal pads that are electrically connected to the first and second pad sets of terminal pads of the PCB, respectively; and a conductive line formed on the uppermost layer of the PCB substrate between the first pad set of terminal pads and the second set of terminal pads to pass through a region of the PCB substrate located between the first pad set of terminal pads and the second pad set of terminal pads, wherein the conductive line is at least any one of a signal line, a power line and a ground line and wherein the conductive line crosses over the semiconductor packages.

9. The semiconductor module of claim 8, wherein the first and second pad sets of terminal pads are arrayed in a rectangle shape and each of the first and second pad sets of terminal pads comprises at least six terminal pads.

10. The semiconductor module of claim 9, wherein the via holes are respectively disposed in the middle of two rectangle shapes defined by six terminal pads and the conductive connection members are respectively connected to two terminal pads that are positioned in the middle of six terminal pads.

11. The semiconductor module of claim 8, wherein at least one of the first and the second groups of conductive connection members comprises a contact filling up at least one of the via holes; and a trace formed on the substrate to electrically connect the contact and at least one of the terminal pads.

12. The semiconductor module of claim 8, wherein at least one of the terminal pads is a solder mask defined (SMD) type of a bonding pad and the at least one of terminal pads is electrically connected to the external terminal pad of the semiconductor package by a solder ball.

* * * * *